US010991812B2

(12) United States Patent
Siemieniec et al.

(10) Patent No.: US 10,991,812 B2
(45) Date of Patent: Apr. 27, 2021

(54) TRANSISTOR DEVICE WITH A RECTIFIER ELEMENT BETWEEN A FIELD ELECTRODE AND A SOURCE ELECTRODE

(71) Applicant: Infineon Technologies Austria AG, Villach (AT)

(72) Inventors: Ralf Siemieniec, Villach (AT); Robert Haase, San Pedro, CA (US); Gerhard Noebauer, Villach (AT); Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 175 days.

(21) Appl. No.: 16/045,335

(22) Filed: Jul. 25, 2018

(65) Prior Publication Data
US 2019/0035915 A1   Jan. 31, 2019

(30) Foreign Application Priority Data

Jul. 26, 2017  (EP) ..................... 17183358

(51) Int. Cl.
*H01L 29/78* (2006.01)
*H01L 29/66* (2006.01)
(Continued)

(52) U.S. Cl.
CPC .... *H01L 29/66712* (2013.01); *H01L 29/0696* (2013.01); *H01L 29/407* (2013.01);
(Continued)

(58) Field of Classification Search
CPC ............. H01L 29/0692; H01L 29/0696; H01L 29/407; H01L 29/4238; H01L 29/66712;
(Continued)

(56) References Cited

U.S. PATENT DOCUMENTS 7,768,064 B2   8/2010  Sapp et al.
9,812,535 B1  11/2017  Haase et al.
(Continued)

FOREIGN PATENT DOCUMENTS

DE       102005052734 B4    2/2012

*Primary Examiner* — Matthew C Landau
*Assistant Examiner* — Dmitriy Yemelyanov
(74) *Attorney, Agent, or Firm* — Murphy, Bilak & Homiller, PLLC

(57) ABSTRACT

Disclosed is a transistor device. The transistor device includes: in a semiconductor body, a drift region, a body region adjoining the drift region, and a source region separated from the drift region by the body region; a gate electrode dielectrically insulated from the body region by a gate dielectric; a source electrode electrically connected to the source region; at least one field electrode dielectrically insulated from the drift region by a field electrode dielectric; and a rectifier element coupled between the source electrode and the field electrode. The field electrode and the field electrode dielectric are arranged in a first trench that extends from a first surface of the semiconductor body into the semiconductor body. The rectifier element is integrated in the first trench in a rectifier region that is adjacent at least one of the source region and the body region.

18 Claims, 5 Drawing Sheets

(51) Int. Cl.
  *H01L 29/06* (2006.01)
  *H01L 29/40* (2006.01)
  *H01L 29/423* (2006.01)

(52) U.S. Cl.
  CPC .... *H01L 29/66734* (2013.01); *H01L 29/7803* (2013.01); *H01L 29/7804* (2013.01); *H01L 29/7813* (2013.01); *H01L 29/0692* (2013.01); *H01L 29/4238* (2013.01); *H01L 29/7806* (2013.01)

(58) Field of Classification Search
  CPC ........... H01L 29/66734; H01L 29/7803; H01L 29/7804; H01L 29/7806; H01L 29/7813; H01L 29/66; H01L 29/78
  See application file for complete search history.

(56) References Cited

U.S. PATENT DOCUMENTS

| | | | |
|---|---|---|---|
| 2007/0023830 A1* | 2/2007 | Pfirsch | H01L 29/7804 257/341 |
| 2007/0138544 A1* | 6/2007 | Hirler | H01L 29/7808 257/330 |
| 2010/0213505 A1* | 8/2010 | Hirler | H01L 29/7397 257/139 |
| 2012/0061753 A1 | 3/2012 | Nishiwaki | |
| 2013/0248992 A1 | 9/2013 | Padmanabhan et al. | |
| 2013/0248993 A1 | 9/2013 | Sedlmaier et al. | |
| 2014/0084295 A1 | 3/2014 | Hirler et al. | |
| 2015/0048445 A1 | 2/2015 | Noebauer et al. | |
| 2016/0064496 A1 | 3/2016 | Siemieniec et al. | |
| 2016/0079376 A1* | 3/2016 | Hirler | H01L 29/41758 257/328 |

* cited by examiner

TRANSISTOR DEVICE WITH A RECTIFIER ELEMENT BETWEEN A FIELD ELECTRODE AND A SOURCE ELECTRODE

TECHNICAL FIELD

This disclosure in general relates to a transistor device, in particular a transistor device with a field electrode.

BACKGROUND

Transistor devices such as MOSFETs (Metal Oxide Semiconductor Field-Effect Transistors) are widely used as electronic switches in various types of automotive, industrial, household, or consumer electronic applications. Transistor devices used as electronic switches are often referred to as power transistor devices and are available with voltage blocking capabilities of between several 10 volts and several kilovolts. One goal in the design of power transistor devices is to achieve a low on-resistance at a given voltage blocking capability and a given area of the transistor device. The "on-resistance" is the electrical resistance in a switched-on state of the transistor device, the "voltage blocking capability" is the voltage level the transistor device can withstand in a switched-off state (off-state), and the "area" is the area of a semiconductor body in which the transistor device is integrated.

In a MOSFET, the on-resistance is mainly defined by a length and a doping concentration of a drift region, wherein the length is the dimension of the drift region in a current flow direction. Basically, at a given length of the drift region, an increase of the doping concentration results in a decrease of the on-resistance, but also in a decrease of the voltage blocking capability, unless additional measures are taken. One way to increase the doping concentration without decreasing the voltage blocking capability is to implement at least one field electrode that is adjacent the drift region, dielectrically insulated from the drift region by a field electrode dielectric, and connected to one of a source node and a gate node. The at least one field electrode, in the off-state, provides a counter-charge to ionized dopant atoms in the drift region and, therefore, "compensates" a share of the overall dopant charge in the drift region.

The at least one field electrode, together with the field electrode dielectric and the drift region, forms a capacitor between a drain node and a source node of the transistor device. This capacitor is charged when the transistor device switches off and discharged when the transistor device switches on. Charging this capacitor may cause voltage spikes between the drain node and the source node. These voltage spikes, which may be higher than the voltage blocking capability, are undesirable. There is therefore a need to provide a transistor device with a field electrode in which voltage peaks induced by charging the capacitor formed by the field electrode, the field electrode dielectric, and the drift region do not occur or, at least, are reduced.

SUMMARY

One example relates to a transistor device. The transistor device includes a drift region, a body region adjoining the drift region, and a source region separated from the drift region by the body region in a semiconductor body. The transistor device further includes a gate electrode dielectrically insulated from the body region by a gate dielectric, a source electrode electrically connected to the source region, at least one field electrode dielectrically insulated from the drift region by a field electrode dielectric, and a rectifier element coupled between the source electrode and the field electrode. The field electrode and the field electrode dielectric are arranged in a first trench that extends from a first surface of the semiconductor body into the semiconductor body. The rectifier element is integrated in the first trench in a rectifier region that is adjacent at least one of the source region and the body region.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
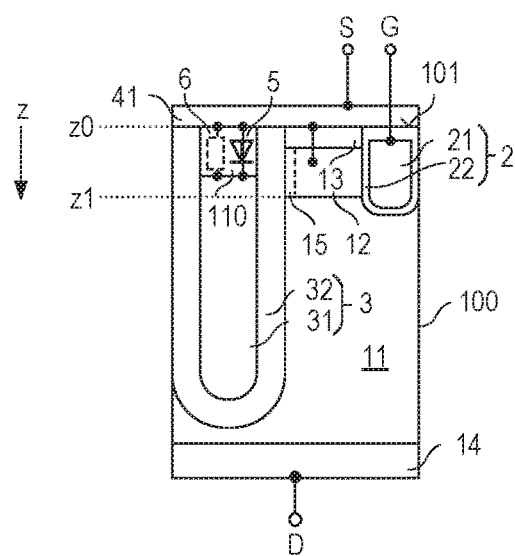
FIG. 1 shows a vertical cross-sectional view of a transistor device with a drift region, a field electrode adjacent the drift region, and a rectifier element coupled between the field electrode and a source electrode and integrated in a rectifier region adjacent a body region and a source region.

FIG. 1 illustrates a vertical cross-sectional view of a transistor device according to one example. The transistor device includes a semiconductor body 100 with a first surface 101, and, in the semiconductor body 100, a drift region 11, a source region 13, and a body region 12, the latter being arranged between the source region 13 and the drift region 11. The semiconductor body 100 includes a monocrystalline semiconductor material such as, for example, silicon (Si) or silicon carbide (SiC). FIG. 1 shows a vertical cross-sectional view of the semiconductor body 100, that is, a view in a section plane perpendicular to the first surface 101.

A gate electrode 21 is arranged adjacent the body region 12 and is dielectrically insulated from the body region 12 by a gate dielectric 22. The source region 13 and the body region 12 are electrically connected to a source electrode 41 arranged on top of the first surface 101. An electrical connection between the body region 12 and the source electrode 41 is only schematically illustrated in FIG. 1. The source electrode 42 forms a source terminal S or is electrically connected to the source terminal S of the transistor device. In the example shown in FIG. 1, the source electrode 41 is drawn to adjoin the source region 13 in any section that adjoins the first surface. This, however, is only an example. According to another example, a dielectric layer may be arranged between the source electrode 41 and the source region 13, and the source electrode 41 may include at least on via or contact plug that extends through the dielectric layer to the source region. One example of such implementation is explained with reference to FIG. 11 herein further below.

In the example shown in FIG. 1, the gate electrode 21 is implemented as a trench electrode, which is an electrode arranged in a trench extending from the first surface 101 into the semiconductor body 100, This, however, is only an example. According to another example (not shown), a section of the drift region 11 extends to the first surface 101, and the gate electrode is a planar gate electrode arranged on top of the surface 101 of the semiconductor body and adjacent the body region and the section of the drift region extending to the first surface. In each case, the gate electrode serves to control a conducting channel in the body 12 region along the gate dielectric 22 between the source region 13 and the drift region 11.

Referring to FIG. 1, the transistor device further includes a drain region 14 connected to a drain terminal D (only schematically illustrated in FIG. 1). The drift region 11 is arranged between the drain region 14 and the body region 12. The drain region 14 may adjoin the drift region 11, as shown in FIG. 1. According to a further embodiment (not shown) a field stop region (not illustrated) of the same doping type as the drift region 11, but more highly doped than the drift region 11, is arranged between the drift region 11 and the drain region 14.

The transistor device further includes a field electrode structure 3 with a field electrode 31 and a field electrode dielectric 32. The field electrode 31 is adjacent the drift region 11 and dielectrically insulated from the drift region 11 by the field electrode dielectric 32. The field electrode 31 is electrically coupled to the source electrode 41, as illustrated in FIG. 1. Alternatively (and not shown in FIG. 1) the field electrode 31 is electrically coupled to the gate electrode 21. The field electrode 31 and the field electrode dielectric 32 are arranged in a first trench that extends from the first surface 101 into the semiconductor body 100. In the example shown in FIG. 1, the first trench with the field electrode 31 and the field electrode dielectric 32 is different from the trench, referred to as second trench in the following, with the gate electrode 21 and the gate dielectric 22.

Referring to FIG. 1, a rectifier element 5 is connected between the source electrode 41 and the field electrode 31. In FIG. 1, only the circuit symbol of the rectifier element 5 is shown, wherein just for the purpose of illustration the rectifier element 5 is drawn as a bipolar diode. Examples of how the rectifier element 5 may be implemented are explained herein further below. The rectifier element is integrated in the first trench in a region 110 between the field electrode 31 and the source electrode 41. This region 110 is referred to as rectifier region in the following. The rectifier region 110 is adjacent at least one of the source region 13 and the body region 12, wherein in the example shown in FIG. 1 the rectifier region is adjacent both the source region 13 and the body region. "Adjacent" includes that the rectifier region is adjacent the at least one of the source region 13 and the body region 12 in a lateral direction of the semiconductor body 100. The "lateral direction" is a direction parallel to the first surface 101 and vertical to a direction in which the body region 12 and the drain region 14 are spaced apart from each other. The direction in which the body region 12 and the drain region 14 are spaced apart from each other is referred to as vertical direction z in the following.

The body region 12 and the drift region 11 are doped semiconductor regions of complementary doping types so that a p-n junction is formed between the body region 12 and the drift region 11. In the example shown in FIG. 1, this p-n junction is at a vertical position z1 of the semiconductor body 100 and is essentially parallel to the first surface 101 of the semiconductor body 100. According to one example, as shown in FIG. 1, the rectifier region 110, in the vertical direction z, does not extend beyond the vertical position z1 of the p-n junction, so that the rectifier region 110 is not adjacent the drift region 11. In other words, the rectifier region 110 and the drift region 11 do not overlap in this example.

Figure 2:
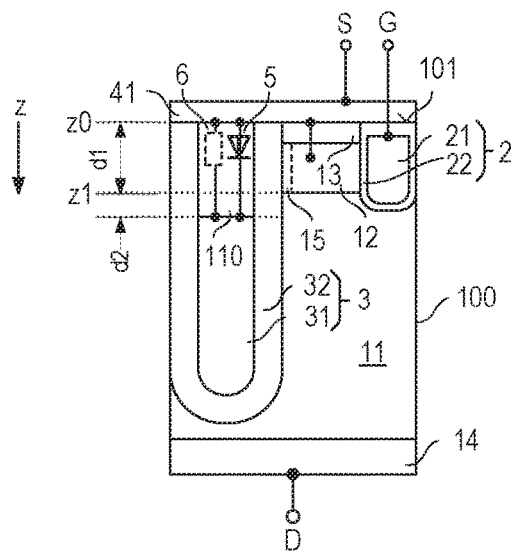
FIG. 2 shows a modification of the transistor device shown in FIG. 1.

FIG. 2 shows a modification of the transistor device shown in FIG. 1. In this example, the rectifier region 110, in the vertical direction, extends beyond the position of the p-n junction so that a section of the rectifier region 110 is adjacent the drift region 11 and the rectifier region 110 and the drift region 11 do overlap. According to one example, the p-n junction is spaced apart from the first surface 101 by a first distance d1 and the rectifier region, as seen from the first surface, does not extend farther beyond the first vertical position than 50% of the first distance. That is, the vertical length d2 of an area where rectifier region 110 and the drift region overlap is less than 50% of the distance between the first surface 101 and the p-n junction.

Referring to FIGS. 1 and 2, an optional resistive element 6 is connected between the field electrode 31 and the one of the source electrode 41 and the gate electrode 21. In FIGS. 1 and 2, the resistive element 6, like the rectifier element 5, is only schematically illustrated using a circuit symbol. Examples of how the resistive element 6 may be implemented are explained in further detail herein below. According to one example, the resistive element 6 is integrated in the rectifier region 110 together with the rectifier element.

The transistor device can be implemented as an n-type transistor device or as a p-type transistor device. In an n-type transistor device, the source region 13 and the drift region 11 are n-doped, while the body region 12 is p-doped. In a p-type transistor device, the source region 13 and the drift region 11 are p-doped, while the body region 12 is n-doped. The transistor device can be implemented as an enhancement (normally-off) transistor device or as a depletion (normally-on) transistor device. In a normally-off device, the body region 12 adjoins the gate dielectric 22. In a normally-on device, a channel region 15 (illustrated in dashed lines in FIGS. 1 to 3) of the same doping type as the source region 13 and the drift region 11 extends between the gate dielectric 22 and the body region 12 from the source region 13 to the drift region 11. According to one example, the transistor device is implemented as a MOSFET (Metal Oxide Semiconductor Field-Effect Transistor). In a MOSFET, the drain region 14 has the same doping type as the drift region 11. The doping concentration of the drift region 11 is, for example, selected from between 1E11 cm$^{-3}$ and 1E17 cm$^{-3}$, the doping concentration of the source region 13 and the drain region 14 is, for example, selected from between 1E18 cm$^{-3}$ and 1E21 cm$^{-3}$, and the doping concentration of the body region 12 is, for example, selected from between 1E15 cm$^{-3}$ and 1E18 cm$^{-3}$.

Figure 3:
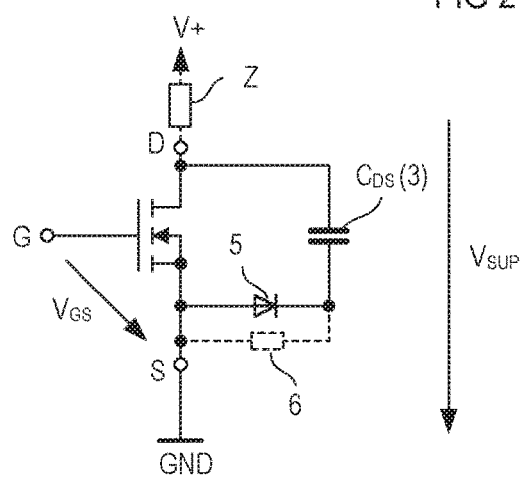
FIG. 3 shows a circuit diagram of the transistor device shown in FIGS. 1 and 2.

The operating principle of a transistor device of the type explained above is explained below. For explanation purposes it is assumed that the transistor device is an n-type enhancement MOSFET. The circuit symbol of this n-type enhancement MOSFET is illustrated in FIG. 3. Referring to FIG. 3, it is further assumed that the transistor device is used as an electronic switch for switching an electrical load Z connected in series with a load path (drain-source path) D-S of the transistor device. In operation, the series circuit with the transistor device and the load Z is connected between terminals for a positive supply potential V+ and a negative supply potential or ground potential GND.

The transistor device is a voltage-controlled transistor device and can be switched on and off by applying a suitable drive voltage (gate-source voltage) $V_{GS}$ between the gate node G and the source node S. An n-type MOSFET switches on when the drive voltage $V_{GS}$ is positive and above a threshold voltage, and switches off when the drive voltage $V_{GS}$ is below the threshold voltage. When the transistor device is switched on, a load path voltage (drain-source voltage) $V_{DS}$ of the transistor device is relatively low so that most of the supply voltage available between the supply nodes drops across the load Z. When, however, the transistor device is switched off and blocks, the supply voltage essentially drops across the drain-source path D-S of the transistor device.

When the transistor device is switched on there is a conducting channel in the body region 12 along the gate dielectric 22 between the source region 13 and the drift region 11, so that a current may flow between the drain and the source terminals D-S when a voltage is applied between these terminals D, S. When a voltage is applied between the drain and source terminals D, S that reverse biases the p-n junction between the body region 12 and the drift region 11 and when the transistor device is switched off, a depletion region (space charge region) expands in the drift region 11 beginning at the p-n junction. The width of the depletion region, which is a dimension of the depletion region in a direction perpendicular to the p-n junction, is dependent on the voltage that reverse biases the p-n junction, where the width of the depletion region increases as the reverse biasing voltage increases. Within the depletion region there are ionized dopant atoms in the drift region 11. These ionized dopant atoms have a positive charge when the drift region 11 is n-doped (and have a negative charge when the drift region 11 is p-doped). Negative charges corresponding to the positive charges in the drift region 11 are located in the body region 12. Due to the fact, that the field electrode 31 is electrically coupled to the source terminal S (or the gate terminal G) and due to the fact, that the electrical potential at the source terminal S (or at the gate terminal G) is lower than the electrical potential in the drift region 11 when the device is in the off-state, negative charges are provided by the field electrode 31. Thus, each ionized dopant atom in the drift region 11 has a corresponding counter charge in the body region 12 or the field electrode 31, wherein the counter charges provided by the field electrode 31 make it possible to implement the transistor device with a higher doping concentration than a transistor device without field electrode, thereby decreasing the on-resistance without decreasing the voltage blocking capability.

The field electrode structure, however increases a drain-source capacitance $C_{DS}$ of the transistor device, which is a capacitance that is effective between the drain node D and the source node S of the transistor device. This drain-source capacitance $C_{DS}$ is represented by a capacitor in the circuit diagram shown in FIG. 3. In order to be able to provide the counter charges mentioned above, the field electrode 31 needs to be charged when the transistor device switches off, while the field electrode 31 needs to be discharged when the transistor device switches on. Charging the field electrode 31 is equivalent to charging the drain-source capacitance $C_{DS}$ shown in FIG. 3, and discharging the field electrode 31 is equivalent to discharging the drain-source capacitance $C_{DS}$.

In the transistor device, the rectifier element 5 and the resistive element 6, the circuit symbols of which are also shown in FIG. 3, are connected between the source node S and the field electrode structure 3, which is represented by the drain-source capacitance $C_{DS}$ in FIG. 3, such that the resistive element 6 governs charging and the rectifier element 5 governs discharging the field electrode 3 structure. That is, the rectifier element 5 is connected between the source node S and the field electrode structure 3 such that the rectifier element 5 is reverse biased and blocks when the field electrode structure 3 is charged, so that the charging current flows through the resistive element 6. Charging the capacitor $C_{DS}$ is associated with a current $C_{DS}$ flowing onto the capacitor $C_{DS}$. This current may rapidly increase from zero to a maximum current level right after the transistor device switches off and slowly decrease as the field electrode structure 3 (the drain-source capacitance $C_{DS}$) is charged. The maximum current level $I_{CDS\_MAX}$ is essentially given by a supply voltage $V_{SUP}$, which is the voltage between the supply nodes, divided by a resistance R6 of the resistor:

$$I_{CDS\_MAX} = \frac{V_{SUP}}{R6}. \quad (1)$$

The higher the maximum current level $I_{CDS\_MAX}$ of the charging current $I_{CDS}$ the greater is a change (an increase) $dI_{CDS}/dt$ of the charging current when the transistor device switches off. Rapid changes of the charging current $I_{CDS}$ may cause voltage spikes induced by parasitic inductances (not shown in the drawings) of a voltage between the drain node D and the source node S of the transistor device. According to one example, the resistive element 6 is therefore designed to have a resistance that limits the maximum current level $I_{CDS\_MAX}$, at a given supply voltage $V_{SUP}$, to be below a predefined threshold in order to limit changes of the charging current such that voltage spikes are reduced. Further, the resistance may help to attenuate oscillations of a parasitic resonant circuit that includes the drain-source capacitance $C_{DS}$ and a parasitic inductance Lp that includes line inductances of connection lines between the transistor device and the load Z. According to one example, the resistor 6 is implemented such that a resistance R6 of the resistor is approximately given by $$R6 = c \cdot \sqrt{\frac{Lp}{C_{DS}}}, \quad (2)$$

where R6 is the resistance, Lp is the parasitic inductance, $C_{DS}$ is the drain-source capacitance, and c is a constant. According to one example, c is selected from between 0.5 and 3, in particular between 0.9 and 1.5.

When the transistor device switches on the field electrode structure 3 (the drain-source capacitance $C_{DS}$) is discharged via the conducting drain-source path of the transistor device. In this operation state, the rectifier element 5 is forward biased so that it bypasses the resistive element 6. The resistive element 6 therefore slows down charging the field electrode structure 3 when the device switches off, but does not slow down discharging the field electrode structure 3 when the transistor device switches from the off-state to the on-state. Thus, via the forward biased rectifier element 6 the field electrode structure 3 is rapidly discharged when the transistor device switches from the off-state to the on-state. The latter is beneficial in view of reducing switching losses.

The transistor device may include a plurality of identical device structures, known as transistor cells. Each transistor cell includes a section of the source region 13, a section of the body region 12, a gate electrode 21 or a section of a gate electrode 21 adjacent the body region 12, a section of the drift region 11, a section of the drain region 14 and a field electrode structure 3 or a section of a field electrode structure adjacent the drift region 11. Two or more transistor cells may share one gate electrode 21 and/or two or more transistor cells may share one field electrode structure 3. In each of FIGS. 1 and 2 a cross-sectional view of one transistor cell is shown.

Figure 4:
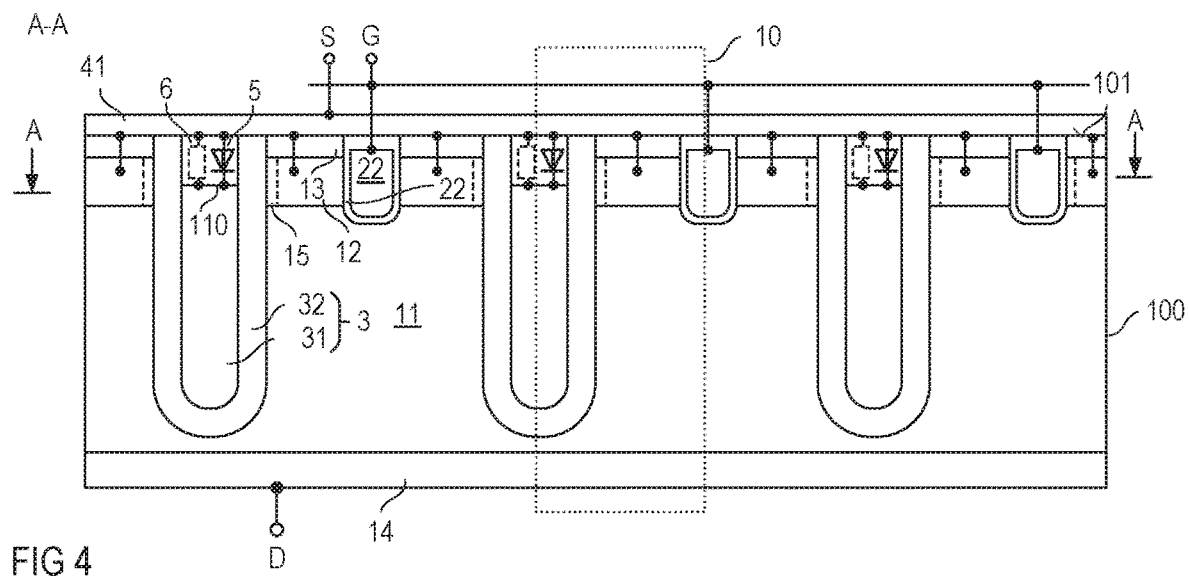
FIG. 4 shows a vertical cross-sectional view of a transistor device that includes a plurality of device structures of the type shown in FIG. 1.

FIG. 4 shows a vertical cross-sectional view of a transistor device with several transistor cells. Just for the purpose of illustration, the individual transistor cells shown in FIG. 4 are transistor cells of the type shown in FIG. 1 in which the rectifier region 110 does not extend beyond the p-n junction in the vertical direction z. However, transistor cells of the type shown in FIG. 2 may be used as well. In FIG. 4, reference character 10 denotes one of these transistor cells. The individual transistor cells are connected in parallel by having the source region 13 and the body region 12 electrically connected to the source electrode 41, wherein each transistor cell includes a section of the source region 13 and a section of the body region 12, and by having the gate electrodes 21 electrically connected to a gate terminal G (that is only schematically illustrated in FIG. 1). The connection between the gate electrodes 21 and the gate terminal G is only schematically illustrated in FIG. 1. This connection can be implemented in a conventional way. Further, the individual transistor cells are connected in parallel in that the individual transistor cells share the drift region 11 and the drain region 14 connected to the drain node. In the examples shown in FIGS. 1, 2, and 4, the field electrode structures 3 are spaced apart from the drain region 14. According to another example (not shown) the field electrode structures 3 extend to or into the drain region 14.

Figure 5:
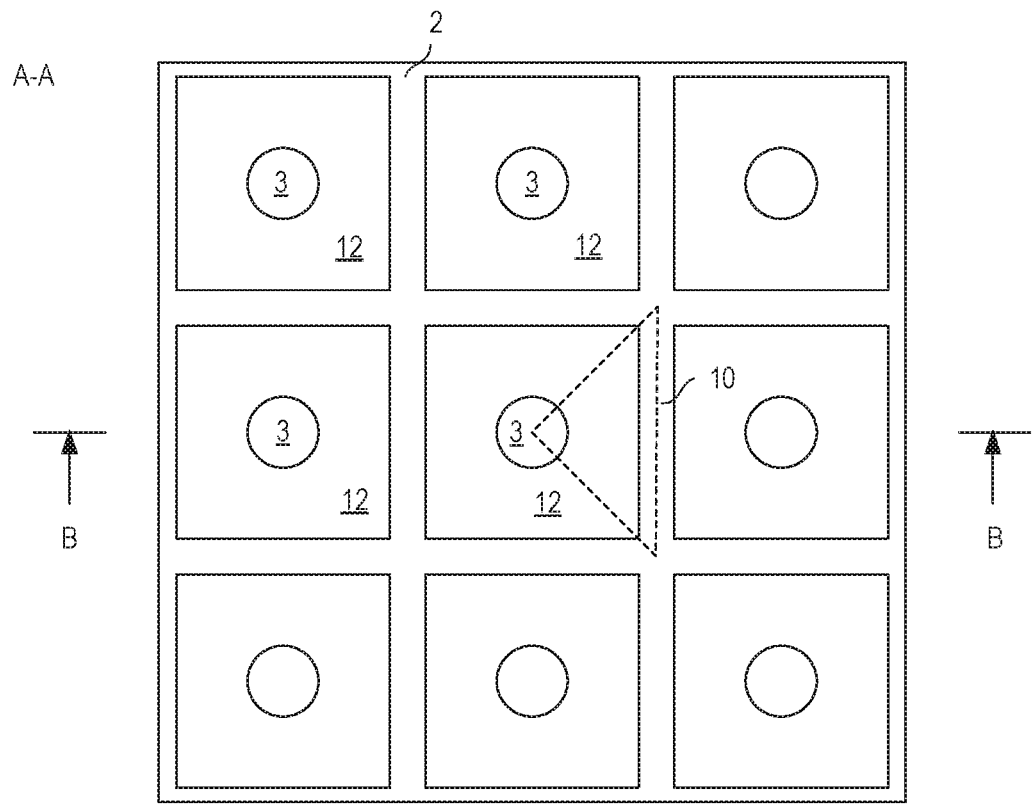
FIG. 5 shows a horizontal cross-sectional view of one example of a transistor device of the type shown in FIG. 4.

FIG. 5 shows a horizontal cross-sectional view of one example of a transistor device of the type shown in FIG. 4. In this example, the field electrode structures 3 and, therefore the first trenches in which these field electrode structures 3 are located, each have the shape of a column (spicule or needle). This type of field electrode structure 3 is referred to as columnar (spicular or needle-shaped) field electrode structure 3 in the following. According to one example, in a columnar field electrode structure 3, a dimension of the field electrode structure 3 in any lateral direction is smaller than a dimension of the field electrode structure 3 in the vertical direction. In particular, the dimension of the field electrode 31 in any lateral direction is smaller than a dimension of the field electrode 31 in the vertical direction. Let d3 be the dimension of the field electrode 31 in the vertical direction and w1 be the largest lateral dimension of the field electrode 31 then, according to one example, a ratio d3/w1 is greater than 2, greater than 5, greater than 10, or even greater than 20.

In the example shown in FIG. 5, the gate electrode structure 2, in the horizontal plane, has the shape of a grid with a plurality of grid openings (which may also be referred to as loops). Just for the purpose of illustration, the gate electrode structure 2 is drawn to have the shape of a grid with rectangular grid openings in the example shown in FIG. 5. This, however, is only an example. Any other type of grid shape, such as a grid with hexagonal openings or with any other type of polygonal openings may be implemented as well. In the example shown in FIG. 5, in each of the plurality of grid openings of the grid shaped gate electrode structure 2 a corresponding one of the plurality of field electrode structures 3 is arranged. This, however, is only an example. According to another example (not shown), two or more field electrode structures 3 are arranged in each of these grid openings.

In a transistor device with a grid shaped gate electrode structure 20, as shown in FIG. 5, there is one gate electrode structure 2 that is shared by the individual transistor cells. The outline of one transistor cell 10 is illustrated in dotted lines in FIG. 5.

Figure 6:
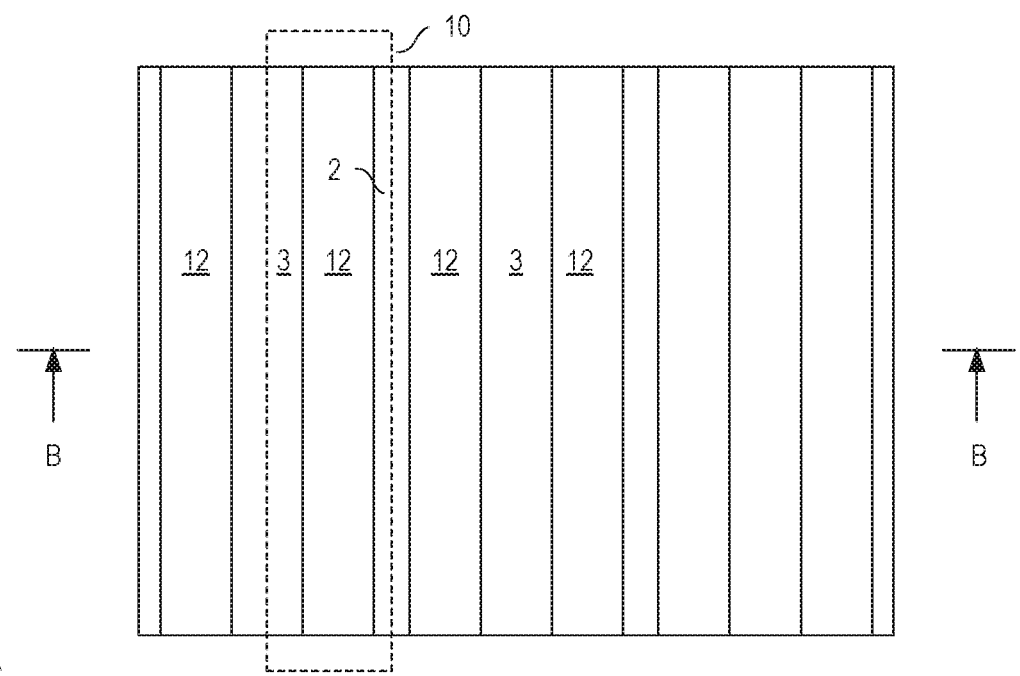
FIG. 6 shows a horizontal cross-sectional view of another example of a transistor device of the type shown in FIG. 4.

FIG. 6 shows a horizontal cross-sectional view of another example of a transistor device of the type shown in FIG. 4. In the example shown in FIG. 6, the field electrode structures 3 are elongated in one horizontal direction of the semiconductor body. "Elongated" in this context means that a length l1 of the individual field electrode structures is much greater than a width w1. According to one example, a ratio l1/w1 is greater than 10, greater than 20, greater than 50, or even greater than one 100. Like the field electrode structures 3, the gate electrode structures 2 are also elongated structures in this example. In a transistor device with elongated field electrode structures 3 and elongated gate electrode structures 2, as shown in FIG. 6, two adjacent transistor cells 10 share one gate electrode structure 2, and two adjacent transistor cells share one field electrode structure 3. The outline of one transistor cell is shown in dashed lines in FIG. 6.

Figure 7:
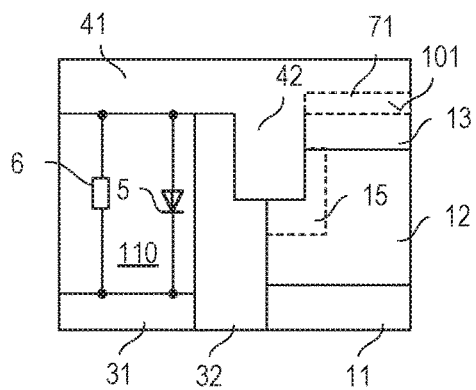
FIG. 7 illustrates one example of how the source electrode may be connected to the body region.
Figure 8:
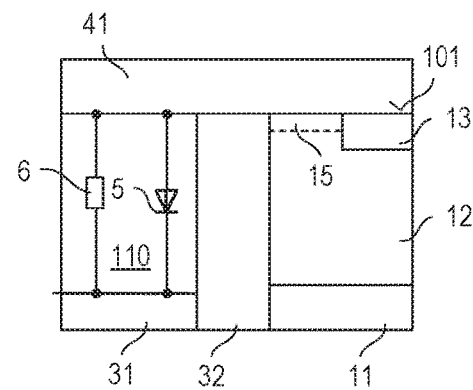
FIG. 8 illustrates another example of how the source electrode may be connected to the body region.

Referring to the above, the body region 12 is electrically connected to the source electrode 42. Two examples of how the body region 12 may be connected to the source electrode 42 are illustrated in FIGS. 7 and 8. Each of these Figures shows an enlarged cross-sectional view of a region of the transistor device where the body region 12 is connected to the source electrode 41. In the example shown in FIG. 7, the source electrode 41 includes an electrically conductive plug 42 which, in the vertical direction z of the semiconductor body 100, extends down to the body region 12. Optionally, the body region 12 includes a contact region 15 of the same doping type as other regions of the body region 12, but more highly doped than these other regions. The contact region 15 adjoins the contact plug 42 and provides an ohmic contact between the contact plug 42 and the body region 12. In the example shown in FIG. 7, the contact plug 42 adjoins both, the source region 13 and the field electrode dielectric 32 adjacent the rectifier region 110 extends to the first surface 101 of the semiconductor body. Optionally, in a region that is laterally adjacent the contact plug 41 a dielectric layer 71 may be arranged between the source region 13 and the source electrode 41.

In the example shown in FIG. 8, the body region 12 includes a section that, adjacent the source region 13 extends to the surface 101 where it is contacted by the source electrode 41. Optionally, the body region 12 includes a contact region 15 of the type explained above in those regions where it is contacted by the source electrode 41.

Referring to the above, the rectifier element 5 and the resistive element 6 may be implemented in various ways. Some examples of how the rectifier element 5 and the resistive element 6 may be implemented in the rectifier region 110 are illustrated in FIGS. 9 to 12 and explained in the following.

Figure 9:
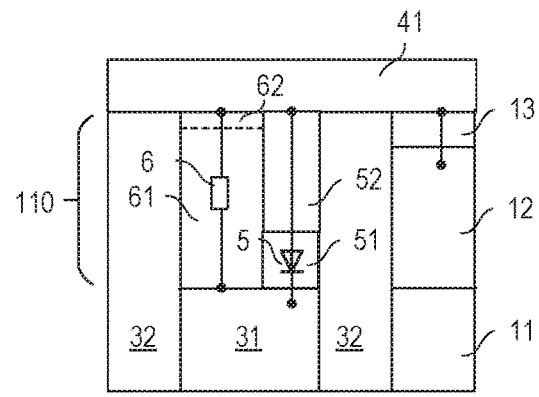
FIG. 9 illustrates one example of a rectifier element implemented as a bipolar diode and of a resistor both integrated in the rectifier region.

In the example shown in FIG. 9, the field electrode 31 includes a semiconductor material of a first doping type. According to one example, the semiconductor material is a polycrystalline semiconductor material such as polysilicon. The rectifier element 5 includes a doped region 51 of a doping type complementary to the doping type of the field electrode 31, wherein the doped region 51 of the rectifier element 5 adjoins the field electrode 31 so that a p-n junction is formed between the doped region 51 and the field electrode 31. The p-n junction between the doped region 51 and the field electrode 31 forms the rectifier element. In this example, the rectifier element is a bipolar diode with the doped region 51 forming an anode region and the field electrode 31 forming a cathode region. According to one example, the doped region 51 includes the same type of semiconductor material as the field electrode 31, so that, according to one example, the doped region 51 includes polysilicon. The doped region 51 is electrically (ohmically) connected to the source electrode 41 by a contact plug 52. This contact plug 52 includes an electrically conducting material such as, for example, a metal or a highly doped polycrystalline semiconductor material such as polysilicon of the same doping type as the doped region 51, but more highly doped.

Referring to FIG. 9, the resistive element 6 includes a resistive region 61 connected between the source electrode 41 and the field electrode 31. According to one example, the resistive region 61 is a doped semiconductor region of the same doping type as the field electrode 31, but more lowly doped than the field electrode 31. Optionally, a contact region 62 of the same doping type as the resistive region 61, but more highly doped than the resistive region 61 is arranged between the resistive region 61 and the source electrode 41. This contact region 62 provides for an ohmic contact between the source electrode 41 and the resistive region 61. A doping concentration of the field electrode 31 is, for example, higher than 1E21 cm$^{-3}$, a doping concentration of the contact region is, for example, selected from a range of between 5E18 cm$^{-3}$ and 1E19 cm$^{-3}$, a doping concentration of the resistive region 61 is, for example, lower than 1E16 cm$^{-3}$, and a doping concentration of the doped region 51, which forms an anode region of the bipolar diode in the example shown in FIG. 9, is selected from a range of between 1E18 cm$^{-3}$ and 1E19 cm$^{-3}$.

Referring to the above, the contact plug 52 includes (a) a doped semiconductor material of the same doping type as the doped region (anode region) 51, or (b) a metal, wherein the metal may be a Schottky metal. In case (a) there is a pn-junction between the contact plug 52 and the resistive region 61, and in case (b) there is a Schottky junction between the contact plug 52 and the resistive region 61. In each of these cases, the junction between the resistive region 61 and the contact plug 52 is reverse biased when the p-n junction between the field electrode 31 and the anode region 51 is reverse biased. Thus, when a current flows through the resistive region 61 there is no cross current into the contact plug 52, so that the contact plug 52 does not bypass the resistive region 61.

Figure 10:
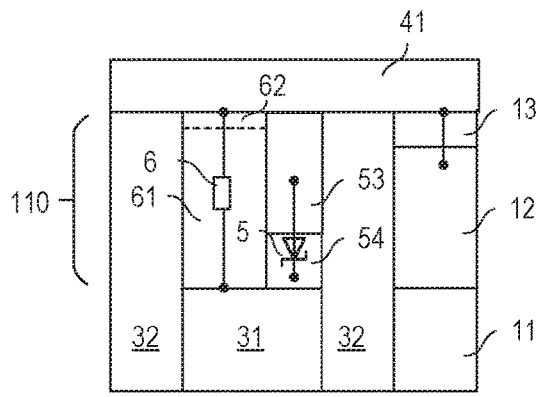
FIG. 10 illustrates one example of a rectifier element implemented as a Schottky diode and of a resistor both integrated in the rectifier region.

FIG. 10 shows a rectifier element 5 that is different from the rectifier element 5 shown in FIG. 9 in that the doped region 51 is replaced by a Schottky region 54 of the same doping type as the field electrode 31 and the resistive region 61. According to one example, a doping concentration of the Schottky region 54 equals the doping concentration of the resistive region 61. The Schottky region 54 is electrically (ohmically) connected to the source electrode 41 by a contact plug 53, wherein between the Schottky region 54 and the contact plug 53 a Schottky contact is formed. This Schottky contact forms the rectifier element 5. The rectifier element is a Schottky diode in this example. The contact plug 53 includes a metal that is suitable to form the Schottky contact with the Schottky region 54. Examples of this metal include, but are not restricted to, titanium (Ti), titanium nitride (TiN), tungsten (W), a titanium-tungsten alloy (TiW), or molybdenum (Mo). These metals may also be used to implement the contact plug 52 shown in FIG. 7. The resistive element 6 may be implemented in the same way as the resistive element 6 shown in FIG. 9.

In the examples shown in FIGS. 9 and 10 an electrical connection between the body region 12 and the source electrode 41 is only schematically shown. Each of these connections may be implemented by any of the connections explained with reference to FIGS. 7 and 8.

Figure 11:
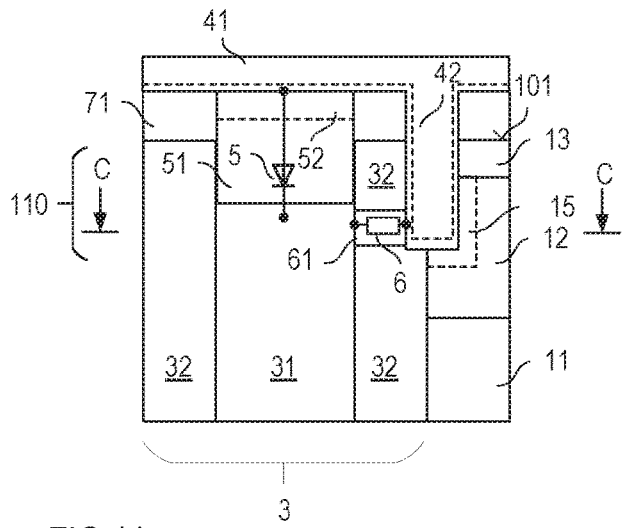
FIG. 11 illustrates another example of a rectifier element implemented as a bipolar diode and of a resistor both integrated in the rectifier region.

FIG. 11 shows a rectifier element 5 and a resistive element 6 according to another example. In this example, the resistive element 6 includes a resistor region 61 between the field electrode 31 and a contact plug 42 of the source electrode 41. In this example, the field electrode dielectric 32 includes an opening between the field electrode 31 and the contact plug 42 in which the resistive region 61 is arranged. Different from the example shown in FIGS. 9 and 10, the resistive region 61, in a lateral direction, extends between the field electrode 31 and the source electrode 41. The rectifier element 5 is implemented like in the example shown in FIG. 9 and includes a diode region 51 between the field electrode 31 and the source electrode 41. The contact plug 52 is optional and may be omitted. Instead of the doped region 51 shown in FIG. 11, a Schottky region as explained with reference to FIG. 10 may be used. In the example shown in FIG. 11, the contact plug 42 is not only connected to the resistive region 61 of the resistor 6 but also to the source region 13 and the body region 12. In this example, an insulator may be arranged between the first surface 101 of the semiconductor body and the source electrode 41.

Figure 12:
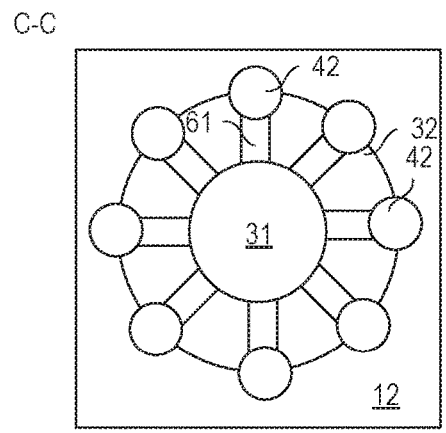
FIG. 12 shows a horizontal cross-sectional view of the rectifier region of one example of a transistor device of the type shown in FIG. 11.

FIG. 12 shows a horizontal cross-sectional view of a device of the type shown in FIG. 11 and with a needle shaped field electrode. In this example, the source electrode 41 may include a plurality of contact plugs 42 that are located around the needle shaped field electrode structure, wherein a resistive region 61 is arranged between each of these contact plugs 42 and the field electrode 31.

In each of the examples explained above, a rectifier element 5 and a resistive element 6 are integrated in a rectifier region 110 of a first trench. By this, the rectifier element 5 and the resistive element 6 can be realized in a space saving manner. Further, in an example with several field electrodes 31 each field electrode 31 has a corresponding rectifier element 5 and a corresponding resistive element 6 in close proximity to the field electrode 31 so that there are no connection lines between the field electrode 31 and the resistive element 6. Those connection lines may increase the resistance and may have the effect that different transistor cells, dependent on their distance to the position where the resistive element is arranged, may have different resistances that govern charging the field electrode structure.

One example of a method for forming a resistor 6 and a rectifier element 5 adjacent the field electrode 31 is shown in FIGS. 13A to 13F. Each of these figures shows a vertical cross-sectional view of one section of the field electrode and the region in which the resistor 6 and a rectifier element 5 are formed.

Figure 13A:
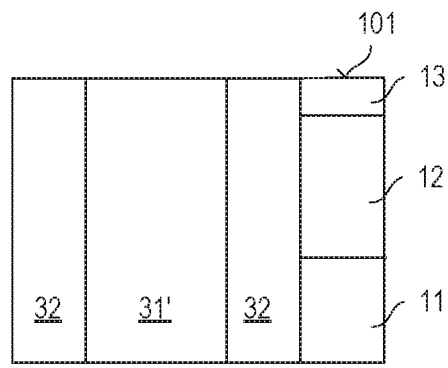
FIGS. 13A to 13F illustrate one example of a method for forming a rectifier element and a resistor adjacent a field electrode in a trench.

Referring to FIG. 13A, the method includes forming a trench, forming the field electrode dielectric 32 along sidewalls of the trench so that a residual trench remains, and filling the residual trench with a field electrode material 31'. The result of this is illustrated in FIG. 13A.

Figure 13B:
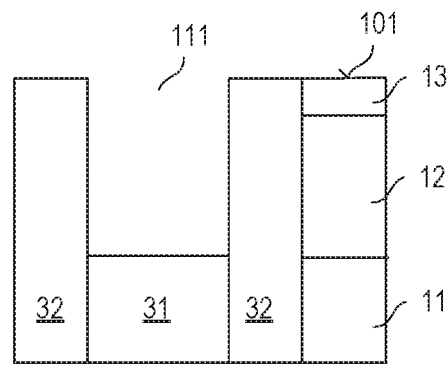

Referring to FIG. 13B, the method includes etching back the field electrode material 31' so as to form a trench 111 within the field electrode dielectric. Those section of the field electrode material 61' that remain below the trench 111 form the field electrode 31.

Figure 13C:
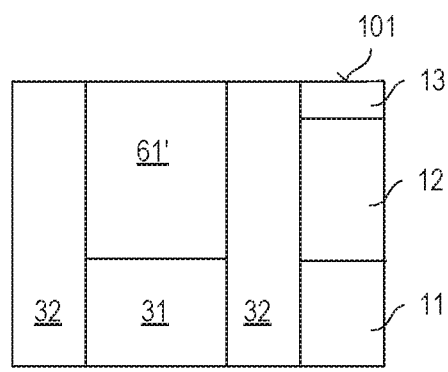

Referring to FIG. 13C, the method further includes filling the trench 111 with a semiconductor material 61' of the same doping type as the field electrode, but more lowly doped. Sections of this semiconductor material 61', which is referred to as resistive region material 61' in the following, form the resistive region 61 in the finished device.

Figure 13D:
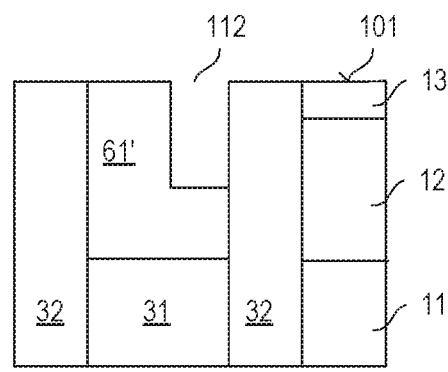

Referring to FIG. 13D, the method further includes forming a trench 112 in the resistive region material 61' such that sections of the resistive region material 61' remain next to the trench in at least one lateral direction and below the trench in a vertical direction of the semiconductor body 100. In the example shown in FIG. 13D, the trench 112 adjoins the field electrode dielectric 32. This, however, is only an example. It is also possible to form the trench 112 such that it is spaced apart from the field electrode dielectric 32.

Figure 13E:
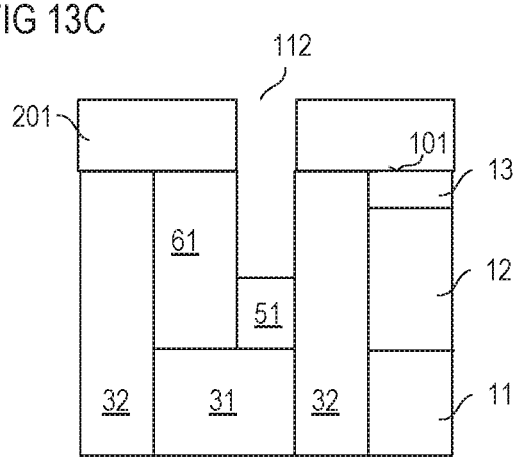

Referring to FIG. 13E, the method further includes forming the diode region (anode region) 51 by introducing dopant atoms of a doping type complementary to the doping type of the field electrode 31 and the resistive region 61 into the section of the resistive region material 61' between a bottom of the trench 112 and the field electrode 31. Introducing the dopant atoms may include an implantation process using an implantation mask 201.

Figure 13F:
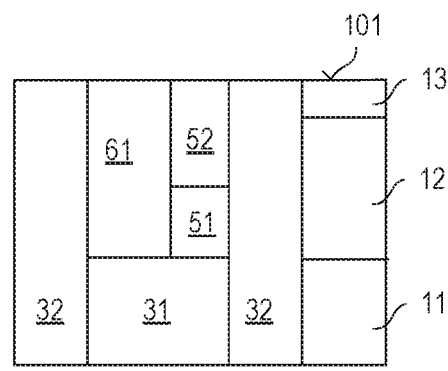
Figure 14A:
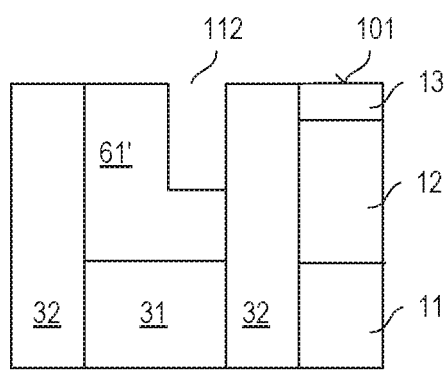
FIGS. 14A and 14B illustrate a modification of the method shown in FIGS. 13A to 13F.
Figure 14B:
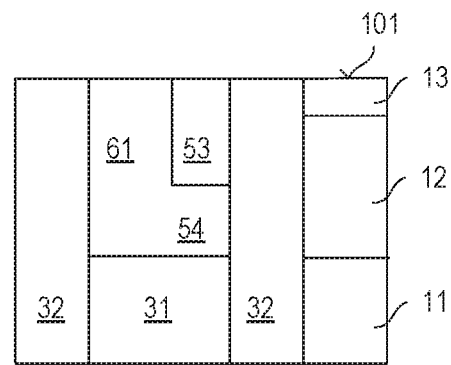

Referring to FIG. 13F, the method further includes forming the contact plug 52 in the trench 112. The device structure shown in FIG. 13F is the device structure shown in FIG. 9 in which the rectifier element is a bipolar diode. FIGS. 14A and 14B show a modification of this method, which may be used to form a Schottky diode as the rectifier element.

The method shown in FIGS. 14A and 14B is different from the method shown in FIGS. 13A to 13F in that after forming the trench 112 in the resistive region material 61', which is shown in FIG. 14A, the contact plug 53 of the Schottky metal is formed in the trench 53, which is shown in FIG. 14B. In this example, a section of the resistive region material 61' arranged between the contact plug 53 and the field electrode 31 forms the Schottky region 54.

Examples of the transistor device explained herein above relate to:

Example 1. A transistor device, including: in a semiconductor body, a drift region, a body region adjoining the drift region, and a source region separated from the drift region by the body region; a gate electrode dielectrically insulated from the body region by a gate dielectric; a source electrode electrically connected to the source region; at least one field electrode dielectrically insulated from the drift region by a field electrode dielectric; and a rectifier element coupled between the source electrode and the field electrode, wherein the field electrode and the field electrode dielectric are arranged in a first trench that extends from a first surface of the semiconductor body into the semiconductor body, and wherein the rectifier element is integrated in the first trench in a rectifier region that is adjacent at least one of the source region and the body region.

Example 2. The transistor device of example 1, wherein the first trench has the shape of a column, and wherein the source region and the body region surround the at least one first trench in horizontal planes of the semiconductor body.

Example 3. The transistor device of example 1, wherein the first trench has a longitudinal shape with two opposing longitudinal sides, and wherein the source region and the body region are adjacent each of the two opposing longitudinal sides.

Example 4. The transistor device of one of examples 1 to 3, further including: a p-n junction formed between the body region and the drift region, wherein the pn junction is located at a first vertical position of the semiconductor body.

Example 5. The transistor device of example 4, wherein the rectifier region, as seen from the first surface, does not extend beyond, the first vertical position.

Example 6. The transistor device of example 4, wherein the pn junction is spaced apart from the first surface by a first distance, and wherein the rectifier region, as seen from the first surface, does not extend farther beyond the first vertical position than 50% of the first distance.

Example 7. The transistor device of one of the preceding examples, wherein the gate electrode and the gate dielectric are arranged in a second trench spaced apart from the first trench in at least one lateral direction of the semiconductor body.

Example 8. The transistor device of example 7, wherein the first trench has a needle shape, and wherein the second trench surrounds the first trench.

Example 9. The transistor device of example 8, wherein the second trench has the shape of a grid with a plurality of grid openings, wherein the transistor device includes a plurality of field electrodes each arranged in a respective one of a plurality of first trenches, and wherein at least one first trench is arranged in each of the plurality of grid openings.

Example 10. The transistor device of one of examples 1 to 9, wherein the rectifier element comprises a bipolar diode.

Example 11. The transistor device of example 10, wherein the field electrode comprises a semiconductor material of a first doping type, wherein the bipolar diode comprises a pn junction between the field electrode and a semiconductor region of a second doping type complementary to the first doping type, and wherein the semiconductor region of the second doping type is coupled to the source electrode.

Example 12. The transistor device of example 11, wherein the semiconductor material of the field electrode is a polycrystalline semiconductor material, and wherein the semiconductor region of the second doping type is a polycrystalline semiconductor region.

Example 13. The transistor device of one of examples 1 to 9, wherein the rectifier element comprises a Schottky diode.

Example 14. The transistor device of example 10, wherein the field electrode comprises a semiconductor material of a first doping type, wherein the Schottky diode comprises a Schottky region of the first doping type and more lightly doped than the semiconductor material of the field electrode and a Schottky metal adjoining the Schottky region of the first doping type, wherein the Schottky region of the first doping type adjoins the field electrode, and wherein the Schottky metal is coupled to the source electrode.

Example 15. The transistor device of example 14, wherein the semiconductor material of the field electrode is a polycrystalline semiconductor material, and wherein the semiconductor region of the first doping type is a polycrystalline semiconductor region.

Example 16. The transistor device of one of the preceding examples, further comprising: a resistor coupled between the source electrode and the field electrode and in parallel with the rectifier element, wherein the resistor is integrated in the rectifier region.

Example 17. The transistor device of example 16, wherein the field electrode comprises a semiconductor material of a first doping type, wherein the resistor comprises a semiconductor region of the first doping type and more lightly doped than the semiconductor material of the field electrode, and wherein the semiconductor region of the first doping type is coupled between the source electrode and the field electrode.

Example 18. The transistor device of example 17, wherein the semiconductor region of the first doping type extends from the source electrode to the field electrode in a vertical direction of the semiconductor body.

Example 19. The transistor device of example 17, wherein the semiconductor region of the first doping type extends from a plug of the source electrode to the field electrode in a lateral direction of the semiconductor body and through the field electrode dielectric.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
   in a semiconductor body, a drift region, a body region adjoining the drift region, and a source region separated from the drift region by the body region;
   a gate electrode dielectrically insulated from the body region by a gate dielectric;
   a source electrode electrically connected to the source region;
   at least one field electrode dielectrically insulated from the semiconductor body by a field electrode dielectric;
   a rectifier element coupled between the source electrode and the field electrode; and
   a resistor coupled between the source electrode and the field electrode and in parallel with the rectifier element,
   wherein the field electrode and the field electrode dielectric are arranged in a first trench that extends from a first surface of the semiconductor body into the semiconductor body,
   wherein the rectifier element is integrated in the first trench in a rectifier region that is adjacent at least one of the source region and the body region,
   wherein the resistor is integrated in the rectifier region,
   wherein the field electrode comprises a semiconductor material of a first doping type,
   wherein the resistor comprises a semiconductor region of the first doping type and more lightly doped than the semiconductor material of the field electrode,
   wherein the semiconductor region of the first doping type is coupled between the source electrode and the field electrode.

2. The transistor device of claim 1, wherein the first trench has the shape of a column, and wherein the source region and the body region surround the first trench in horizontal planes of the semiconductor body.

3. The transistor device of claim 1, wherein the first trench has a longitudinal shape with two opposing longitudinal sides, and wherein the source region and the body region are adjacent each of the two opposing longitudinal sides.

4. The transistor device of claim 1, wherein a p-n junction formed between the body region and the drift region is located at a first vertical position of the semiconductor body.

5. The transistor device of claim 4, wherein as seen from the first surface the rectifier region does not extend beyond the first vertical position.

6. The transistor device of claim 4, wherein the p-n junction is spaced apart from the first surface by a first distance, and wherein as seen from the first surface the rectifier region does not extend farther beyond the first vertical position than 50% of the first distance.

7. The transistor device of claim 1, wherein the gate electrode and the gate dielectric are arranged in a second trench spaced apart from the first trench in at least one lateral direction of the semiconductor body.

8. The transistor device of claim 7, wherein the first trench has a columnar shape, and wherein the second trench surrounds the first trench.

9. The transistor device of claim 8, wherein the second trench is shaped like a grid with a plurality of grid openings, wherein the transistor device comprises a plurality of field electrodes each arranged in a respective one of a plurality of first trenches, and wherein at least one first trench is arranged in each of the plurality of grid openings.

10. The transistor device of claim 1, wherein the rectifier element comprises a bipolar diode.

11. The transistor device of claim 10, wherein the bipolar diode comprises a p-n junction between the field electrode and a semiconductor region of a second doping type complementary to the first doping type, and wherein the semiconductor region of the second doping type is coupled to the source electrode.

12. The transistor device of claim 1, wherein the rectifier element comprises a Schottky diode.

13. The transistor device of claim 12, wherein the Schottky diode comprises a Schottky region of the first doping type and more lightly doped than the semiconductor material of the field electrode and a Schottky metal adjoining the semiconductor region of the first doping type, wherein the Schottky region of the first doping type adjoins the field electrode, and wherein the Schottky metal is coupled to the source electrode.

14. The transistor device of claim 1, wherein the rectifier element comprises a semiconductor region of a second doping type complementary to the first doping type, and wherein the semiconductor region of the second doping type adjoins the field electrode so that a p-n junction is formed between the semiconductor region of the second doping type and the field electrode.

15. The transistor device of claim 1, wherein the field electrode comprises n-type polysilicon, and wherein the rectifier element comprises p-type polysilicon adjoining the n-type polysilicon.

16. A method of manufacturing a transistor device, the method comprising:

in a semiconductor body, forming a drift region, a body region adjoining the drift region, and a source region separated from the drift region by the body region;

forming a gate electrode dielectrically insulated from the body region by a gate dielectric;

forming a source electrode electrically connected to the source region;

forming in a first trench that extends from a first surface of the semiconductor body into the semiconductor body, at least one field electrode dielectrically insulated from the semiconductor body by a field electrode dielectric;

integrating a rectifier element in the first trench in a rectifier region that is adjacent at least one of the source region and the body region, the rectifier element being coupled between the source electrode and the field electrode; and integrating a resistor in the rectifier region, the resistor being coupled between the source electrode and the field electrode and in parallel with the rectifier element, wherein the field electrode comprises a semiconductor material of a first doping type, wherein the resistor comprises a semiconductor region of the first doping type and more lightly doped than the semiconductor material of the field electrode, wherein the semiconductor region of the first doping type is coupled between the source electrode and the field electrode.

17. The method of claim 16, wherein the rectifier element comprises a semiconductor region of a second doping type complementary to the first doping type, and wherein the semiconductor region of the second doping type adjoins the field electrode so that a p-n junction is formed between the semiconductor region of the second doping type and the field electrode.

18. The method of claim 16, wherein the field electrode comprises n-type polysilicon, and wherein the rectifier element comprises p-type polysilicon adjoining the n-type polysilicon.

* * * * *